(12) United States Patent
Chen

(10) Patent No.: US 11,552,106 B2
(45) Date of Patent: Jan. 10, 2023

(54) ARRAY SUBSTRATE AND MANUFACTURING METHOD THEREOF

(71) Applicant: TCL CHINA STAR OPTOELECTRONICS TECHNOLOGYCO., LTD., Shenzhen (CN)

(72) Inventor: Meng Chen, Shenzhen (CN)

(*) Notice: Subject to any disclaimer, the term of this patent is extended or adjusted under 35 U.S.C. 154(b) by 130 days.

(21) Appl. No.: 16/757,389

(22) PCT Filed: Feb. 18, 2020

(86) PCT No.: PCT/CN2020/075679
§ 371 (c)(1),
(2) Date: Apr. 18, 2020

(87) PCT Pub. No.: WO2021/142874
PCT Pub. Date: Jul. 22, 2021

(65) Prior Publication Data
US 2021/0408053 A1  Dec. 30, 2021

(30) Foreign Application Priority Data

Jan. 17, 2020 (CN) .......................... 202010050465.3

(51) Int. Cl.
*H01L 27/12* (2006.01)

(52) U.S. Cl.
CPC .......... *H01L 27/124* (2013.01); *H01L 27/127* (2013.01); *H01L 27/1222* (2013.01); *H01L 27/1244* (2013.01); *H01L 27/1259* (2013.01)

(58) Field of Classification Search
CPC .. H01L 27/1222; H01L 27/124; H01L 27/127
See application file for complete search history.

(56) References Cited

U.S. PATENT DOCUMENTS

| 2011/0096276 | A1 | 4/2011 | Ahn | |
|---|---|---|---|---|
| 2012/0043548 | A1* | 2/2012 | Arai | H01L 29/458 |
| | | | | 257/E29.273 |
| 2013/0032793 | A1* | 2/2013 | Kim | H01L 27/124 |
| | | | | 438/479 |

FOREIGN PATENT DOCUMENTS

| CN | 1959942 | A | 5/2007 |
|---|---|---|---|
| CN | 103531594 | A | 1/2014 |
| CN | 106229260 | A | 12/2016 |
| CN | 106292094 | A | 1/2017 |
| CN | 106783876 | A | 5/2017 |
| CN | 110459607 | A | 11/2019 |
| CN | 110676266 | * | 1/2020 |

(Continued)

OTHER PUBLICATIONS

Machine translated document CN 110676266 (Year: 2020).*

*Primary Examiner* — Ahmed N Sefer

(57) ABSTRACT

An array substrate and a manufacturing method thereof are provided. A patterned metal member of the array substrate includes a patterned first metal layer, a patterned second metal layer, and a patterned copper layer which are sequentially disposed on a substrate. An etching rate at which an etching solution etches the second metal layer is less than another etching rate at which the etching solution etches the first metal layer. An adhesion force between the patterned first metal layer and the substrate is greater than another adhesion force between the patterned copper layer and the substrate.

13 Claims, 4 Drawing Sheets

(56) References Cited

FOREIGN PATENT DOCUMENTS

CN 110676266 A 1/2020
JP H0766423 A 3/1995

* cited by examiner

ARRAY SUBSTRATE AND MANUFACTURING METHOD THEREOF

FIELD OF DISCLOSURE

The present disclosure relates to the field of display technologies, and in particular, to an array substrate and a manufacturing method thereof.

BACKGROUND

In high-generation liquid crystal display panels, metal wires made of copper materials have advantages of low impedance and strong resistance to electromigration, so they replace conventional metal wires made of aluminum materials. However, the copper metal has poor adhesion to a glass and is prone to metal peeling Also, copper metal ions are prone to diffusion, which causes a performance of thin film transistors (TFTs) to deteriorate. A metal layer is usually added to improve an adhesion between a copper metal layer and block the diffusion of copper. In a conventional manufacturing process of a display panel, the added metal layer is usually selected from molybdenum, titanium, and molybdenum-titanium alloy. In a process using molybdenum metal as a bi-metal layer, because a copper/molybdenum structure is prone to bimetallic corrosion during a metal patterning process, and a copper metal corrosion will occur in a subsequent photoresist stripping process, resulting in the copper being hollowed out. The hollowing out of copper can lead to a formation of metal tips. In a subsequent manufacturing process, different layers of metals are prone to electrostatic breakdown, which greatly affects a product yield. A use of molybdenum-titanium alloy as the added metal layer can significantly improve the corrosion of copper metal. However, due to a presence of titanium metal in the molybdenum-titanium alloy, a wet etching solution containing fluorine must be used in a patterning process of the metal, which results in a low etching rate and is prone to a residue of molybdenum and titanium.

Therefore, it is necessary to propose a technical solution to improve the adhesion of the copper layer and prevent copper diffusion. It can also avoid copper corrosion and metal residue problems caused by adding a metal layer.

SUMMARY OF DISCLOSURE

An object of the present disclosure is to provide an array substrate and a manufacturing method thereof to improve an adhesion between a copper and an array substrate and prevent copper diffusion. It can also avoid copper corrosion and metal residue problems caused by adding a metal layer.

In order to achieve the above object, the present disclosure provides an array substrate including a substrate and a patterned metal member. The patterned metal member includes a patterned first metal layer, a patterned second metal layer, and a patterned copper layer that are sequentially disposed on the substrate.

An adhesion force between the patterned first metal layer and the substrate is greater than another adhesion force between the patterned copper layer and the substrate, the patterned metal member is obtained by etching a first metal layer, a second metal layer, and a copper layer that are sequentially disposed on the substrate with an etching solution, an etching rate at which the etching solution etches the second metal layer is less than another etching rate at which the etching solution etches the first metal layer, material of the first metal layer includes molybdenum, and material of the second metal layer is selected from the group consisting of titanium and vanadium.

In the above array substrate, the first metal layer includes a molybdenum layer, and the second metal layer includes a molybdenum-titanium alloy layer.

In the above array substrate, a sum of thicknesses of the first metal layer and the second metal layer is greater than or equal to 5 nanometers and less than or equal to 100 nanometers.

In the above array substrate, the patterned metal member includes a source/drain and a data line, and/or the patterned metal member includes a gate and a scan line.

A manufacturing method of an array substrate includes following steps:

forming a first metal layer arranged full-area over a substrate;

forming a second metal layer arranged full-area on the first metal layer away from the substrate;

forming a copper layer arranged full-area on the second metal layer away from the first metal layer;

forming a photoresist layer on a surface of the copper layer, wherein after the photoresist layer is exposed by a mask and developed by a developer, a remaining area of the photoresist layer covering the copper layer is a reserved area, and another area of the photoresist layer removed by the developer is an etching area; and etching, by an etching solution, the copper layer, the second metal layer, and the first metal layer of the etching area to remove a remaining photoresist layer and obtain a patterned metal member of the array substrate.

An etching rate at which the etching solution etches the first metal layer is greater than another etching rate at which the etching solution etches the second metal layer, and an adhesion force between the first metal layer and the substrate is greater than another adhesion force between the copper layer and the substrate.

In the above manufacturing method of the array substrate, material of the first metal layer includes molybdenum, and material of the second metal layer is selected from the group consisting of titanium and vanadium.

In the above manufacturing method of the array substrate, the first metal layer includes a molybdenum layer, and the second metal layer includes a molybdenum-titanium alloy layer.

In the above manufacturing method of the array substrate, a sum of thicknesses of the first metal layer and the second metal layer is greater than or equal to 5 nanometers and less than or equal to 100 nanometers, and a content of fluorine ions in the etching solution is greater than 0 wt % and less than 0.1 wt %.

In the above manufacturing method of the array substrate, the sum of the thicknesses of the first metal layer and the second metal layer is greater than or equal to 10 nanometers and less than or equal to 50 nanometers, and the content of the fluorine ions in the etching solution is greater than 0 wt % and less than 0.01 wt %.

In the above manufacturing method of the array substrate, a thickness of the first metal layer ranges from 5 nm to 100 nm, and a thickness of the second metal layer ranges from 5 nm to 100 nm.

In the above manufacturing method of the array substrate, the patterned metal member includes a source/drain and a data line, and/or the patterned metal member includes a gate and a scan line.

An array substrate includes a substrate and a patterned metal member. The patterned metal member includes a patterned first metal layer, a patterned second metal layer, and a patterned copper layer that are sequentially disposed on the substrate.

An adhesion force between the patterned first metal layer and the substrate is greater than another adhesion force between the patterned copper layer and the substrate, the patterned metal member is obtained by etching a first metal layer, a second metal layer, and a copper layer that are sequentially disposed on the substrate with an etching solution, an etching rate at which the etching solution etches the second metal layer is less than another etching rate at which the etching solution etches the first metal layer.

In the above array substrate, the first metal layer includes a molybdenum layer, and the second metal layer includes a molybdenum-titanium alloy layer.

In the above array substrate, a sum of thicknesses of the first metal layer and the second metal layer is greater than or equal to 5 nanometers and less than or equal to 100 nanometers.

In the above array substrate, the patterned metal member includes a source/drain and a data line, and/or the patterned metal member includes a gate and a scan line.

The present disclosure provides an array substrate and a manufacturing method thereof. A patterned metal member of the array substrate includes a patterned first metal layer, a patterned second metal layer, and a patterned copper layer which are sequentially disposed on a substrate. An etching rate at which an etching solution etches the second metal layer is less than another etching rate at which the etching solution etches the first metal layer. With the patterned second metal layer and the patterned first metal layer, a problem of metal residues in the second metal layer can be avoided, and a problem of copper hollowing caused by corrosion of the patterned second metal layer can be avoided. Moreover, an adhesion between the patterned first metal layer and the substrate is greater than an adhesion between the patterned copper layer and the substrate, which improves an adhesion of the patterned metal member on the substrate, and can block a diffusion of copper.

DETAILED DESCRIPTION

The technical solutions in the embodiments of the present disclosure are clearly and completely described herein with reference to the drawings in the embodiments of the present disclosure. Apparently, the described embodiments represent only some and not all of the embodiments of the present disclosure. All other embodiments obtained by one of ordinary skill in the art based on the embodiments of the present disclosure fall within the scope of protection of the present disclosure.

Figure 1:
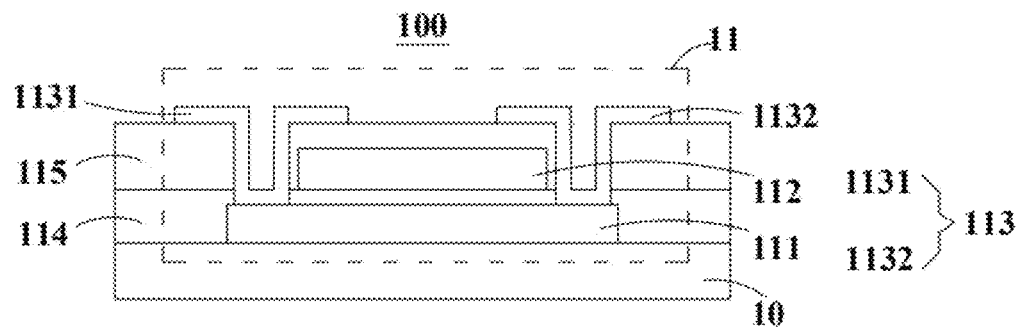
FIG. 1 is a schematic diagram of an array substrate of an embodiment of the present disclosure.
Figure 2:
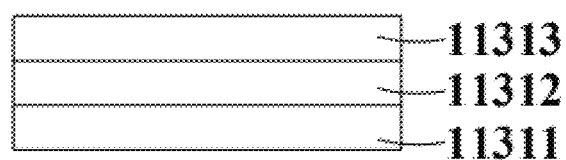
FIG. 2 is a schematic diagram of a source/drain of the array substrate of FIG. 1.

Please refer to FIG. 1 and FIG. 2. FIG. 1 is a schematic diagram of an array substrate of an embodiment of the present disclosure. FIG. 2 is a schematic diagram of a source/drain of the array substrate of FIG. 1. An array substrate 100 is a thin film transistor array substrate. The array substrate 100 can be used in a liquid crystal display panel or an organic light emitting diode display panel. The array substrate 100 includes a substrate 10, a plurality of thin film transistors 11, data lines (not shown), and scan lines (not shown), which are arranged in an array on the substrate 10.

The thin film transistor may be a bottom-gate thin film transistor or a top-gate thin film transistor. In this embodiment, the thin film transistor is a top-gate thin film transistor. The thin film transistor includes an active layer 111, a gate 112, a source/drain 113, a gate insulating layer 114, and an interlayer insulating layer 115. The gate insulating layer 114 is formed between the gate 112 and the active layer 111, and the interlayer insulating layer 115 is formed between the source/drain 113 and the gate 112. The source/drain 113 includes a source electrode 1131 and a drain electrode 1132, and the source electrode 1131 and the drain electrode 1132 are in contact with the active layer 111 through vias on the interlayer insulating layer 115 and the gate insulating layer 114.

In this embodiment, a patterned metal member includes the source/drain 113, the data lines, and other metal wires, which are arranged in the same layer. The patterned metal member is obtained by etching a first metal layer, a second metal layer, and a copper layer which are sequentially disposed on the substrate 10 using an etching solution. An adhesion between the patterned first metal layer and the substrate 10 is greater than another adhesion between the patterned copper layer and the substrate 10. Therefore, the adhesion of the patterned metal member on the substrate 10 can be improved, and it can also prevent copper ions in the copper layer from diffusing into the active layer 111, thereby preventing copper diffusion from affecting an electrical performance of the thin film transistor. An etching rate at which the etching solution etches the second metal layer is less than another etching rate at which the etching solution etches the first metal layer, so that before etching the first metal layer, the second metal layer needs to be completely etched, thereby avoiding a residual of the second metal layer. In addition, the patterned second metal layer will not be corroded, and the patterned copper layer is prevented from being hollowed out caused from the patterned second metal layer is corroded.

The following describes the patterned metal member in combination with the source/drain. The patterned metal member includes a patterned first metal layer 11311, a patterned second metal layer 1312, and a patterned copper layer 11313 that are sequentially disposed on the substrate 10.

The patterned first metal layer 11311 is configured to improve the adhesion between the patterned metal member and the substrate and to block the diffusion of copper, and it also avoids that a residual of the second metal layer after etching. Material of first metal layer includes molybdenum. It may be molybdenum, it may also be a binary alloy including molybdenum, for example, molybdenum-niobium alloy, molybdenum-tantalum alloy, and molybdenum-tungsten alloy, or it may be a ternary alloy including molybdenum, for example, molybdenum-niobium-tungsten alloy.

A thickness of the patterned first metal layer 11311 ranges from 5 nanometers to 100 nanometers. If the thickness of the patterned first metal layer 11311 is too thin, it will lead to poor diffusion barrier to copper, it also will cause easy peeling of the patterned metal member. If the patterned first metal layer 11311 is too thick, it will increase a difficulty of etching and reduce a mass productivity of the array substrate 100. The thickness of the patterned first metal layer 11311 includes 5 nm, 10 nm, and 50 nm.

The patterned second metal layer 11312 is configured to improve copper corrosion during a formation of the patterned copper layer. Since the etching rate at which the etching solution etches the second metal layer is less than the etching rate at which the etching solution etches the first metal layer, the patterned second metal layer is less likely to be corroded. A prerequisite for a formation of copper hollowing is that the patterned second metal layer is corroded, so the patterned second metal layer 11312 can avoid the copper hollowing out of the patterned copper layer. In addition, since the first metal layer needs to be etched after the second metal layer is completely etched, the second metal layer to be removed does not remain. Because the first metal layer is etched at a fast rate, the first metal layer to be removed will not remain. A thickness of the patterned second metal layer 11312 ranges from 5 nanometers and 100 nanometers. For example, the thickness of patterned second metal layer 11312 includes 10 nanometers, 30 nanometers, and 50 nanometers. The second metal layer is made of at least one of titanium and vanadium.

Therefore, when a stacked structure of the first metal layer, the second metal layer, and the copper layer is etched to obtain the patterned metal member, the adhesion between the patterned metal member and the substrate can be improved, metal residues can be avoided, and the problem of copper hollowing can be improved. An ability to block a diffusivity of copper is improved, and an electrical performance of the thin film transistor is affected caused from the diffusion of copper to the active layer is avoided.

Specifically, the first metal layer is a molybdenum layer, and the second metal layer is a molybdenum-titanium alloy layer, such that the adhesion between the patterned metal member and the substrate is improved, and it prevents copper from diffusing into the active layer. Moreover, it can avoid the problems of metal residue and copper hollowing out during the formation of the patterned metal member, thereby reducing a risk of electrostatic breakdown.

Furthermore, a sum of thicknesses of the first metal layer and the second metal layer is greater than or equal to 5 nanometers and less than or equal to 100 nanometers. For example, the sum of the thicknesses of the first metal layer and the second metal layer is 8 nanometers, 10 nanometers, 20 nanometers, or 50 nanometers. The sum of the thicknesses of the first metal layer and the second metal layer is less than or equal to a thickness of a conventional single-layer molybdenum layer or a molybdenum-titanium alloy layer, which reduces the thickness of the molybdenum-titanium alloy and can reduce a content of fluorine ions in the etching solution. The content of fluorine ions in the etching solution is greater than 0 wt % and less than 0.1 wt %, so as to avoid the corrosion of the substrate (it is usually made of glass) caused by the fluorine-containing etching solution and a problem that the substrate cannot be reworked. In the molybdenum-titanium alloy layer, a ratio of the number of molybdenum atoms to titanium atoms is 1:1, and this ratio can also be adjusted as required.

Furthermore, the sum of the thicknesses of the first metal layer and the second metal layer is greater than or equal to 10 nanometers and less than or equal to 50 nanometers, and the content of fluorine ions in the etching solution is greater than 0 wt % and less than 0.01 wt %. This realizes that the first metal layer, the second metal layer, and the copper layer are patterned, and it avoids corrosion of the substrate 10 by the fluorine-containing etching solution, especially when the thin film transistor is a bottom-gate thin film transistor and the gate is directly formed on a glass.

In this embodiment, the patterned metal member includes the source/drain and the data line. In other embodiments, the patterned metal member may also include a gate and a scan line.

Figure 3:
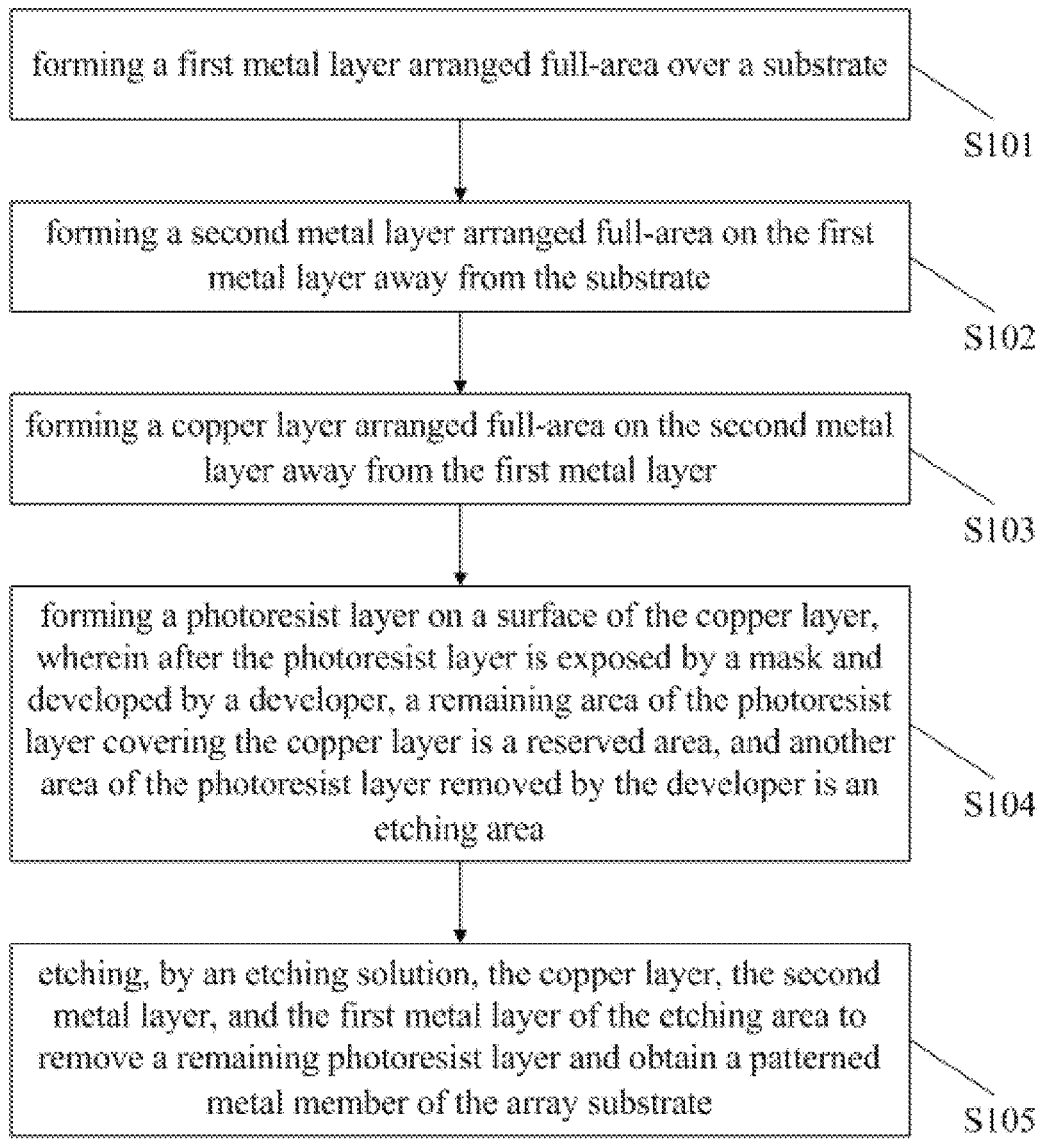
FIG. 3 is a flowchart of a manufacturing method of an array substrate of an embodiment of the present disclosure.

Please refer to FIG. 3, which is a flowchart of a manufacturing method of an array substrate of an embodiment of the present disclosure. The manufacturing method of the array substrate includes the following steps.

In a step S101, a first metal layer arranged full-area is formed over a substrate.

Figure 4A:
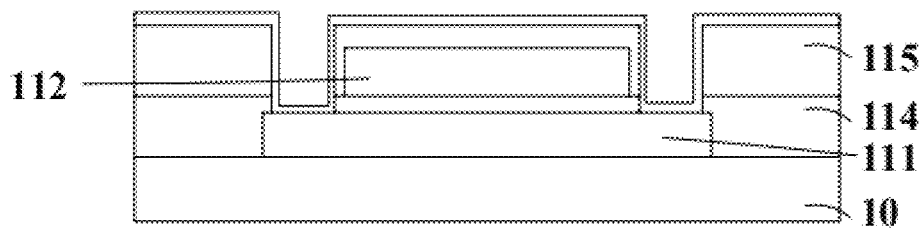
FIG. 4A to FIG. 4E are schematic diagrams showing the array substrate corresponding to the manufacturing method of FIG. 3.

As shown in FIG. 4A, a substrate 10 includes an active layer 111, a gate insulating layer 114, a gate 112, an interlayer insulating layer 115. The gate insulating layer 114 covers the active layer 111 and the substrate 10. The gate 112 is formed on the gate insulating layer 114 and is correspondingly disposed directly above the active layer 111. The interlayer insulating layer 115 covers the gate 112 and the gate insulating layer 114. Communication via holes are formed on the interlayer insulating layer 115 and the gate insulating layer 114 so that part of the active layer 111 is exposed. A first metal layer is formed on a surface of the interlayer insulating layer 115 and its via holes by sputtering. An adhesion between the first metal layer and the substrate 10 is greater than an adhesion between the copper layer and the substrate 10 to improve an adhesion of a patterned metal member to be formed on the substrate 10. The first metal layer is made of molybdenum. A thickness of the first metal layer ranges from 5 nm to 100 nm.

In a step S102, a second metal layer arranged full-area is formed on a surface of the first metal layer away from the substrate.

Figure 4B:
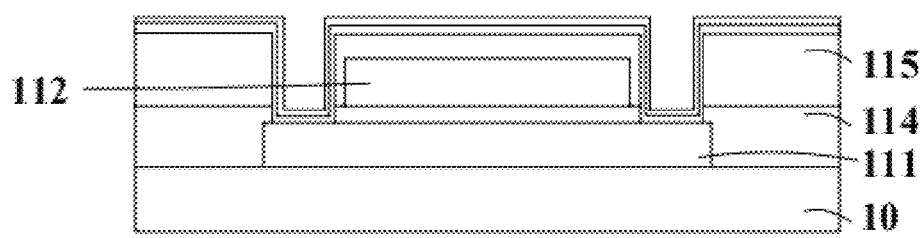

As shown in FIG. 4B, the second metal layer arranged full-area is formed on the surface of the first metal layer away from the substrate by sputtering. The second metal layer is made of at least one of titanium and vanadium. A thickness of the second metal layer ranges from 5 nm to 100 nm.

In a step S103, a copper layer arranged full-area is formed on a surface of the second metal layer away from the first metal layer.

Figure 4C:
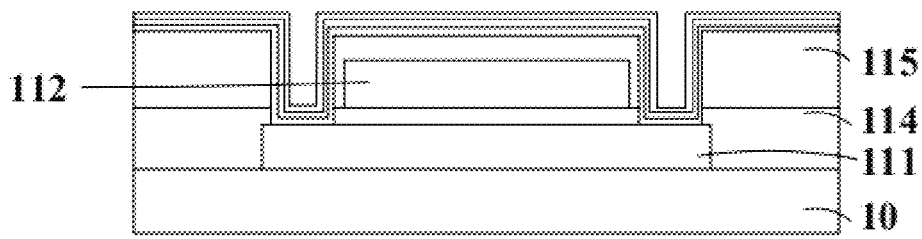

As shown in FIG. 4C, the copper layer arranged full-area is formed on the surface of the second metal layer away from the first metal layer by sputtering. The copper layer makes the patterned metal member to be prepared have good conductivity.

Figure 4D:
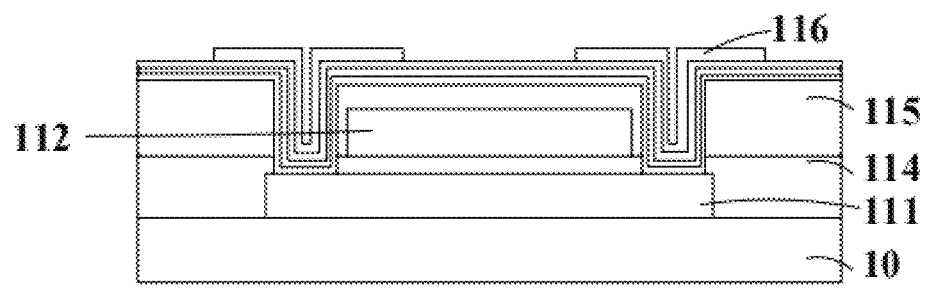

In a step S104, a photoresist layer 116 is formed on a surface of the copper layer. As shown in FIG. 4D, after the photoresist layer 116 is exposed by a mask and developed by a developer, a remaining area of the photoresist layer 116 covering the copper layer is a reserved area, and another area of the photoresist layer 116 removed by the developer is an etching area.

Figure 4E:
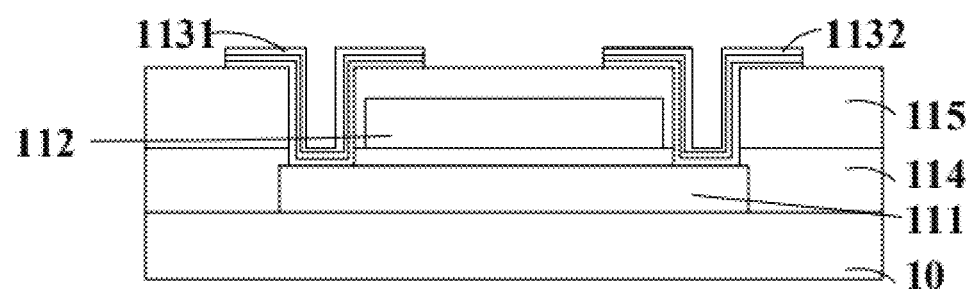

In a step S105, the copper layer, the second metal layer, and the first metal layer of the etching area are etched by using an etching solution to remove a remaining photoresist layer and obtain a patterned metal member of the array substrate;

This stage is wet etching, and the etching solution is etching acid. The etching solution includes hydrogen peroxide, copper ion chelator, fluoride ions, and water. The etching acid is sprayed onto the copper layer to gradually etch the copper layer, the second metal layer, and the first metal layer to form the patterned metal member. As shown in FIG. 4E, the patterned metal member includes source/drain (1131, 1132) and a data line (not shown). An etching rate at which the etching solution etches the first metal layer is greater than another etching rate at which the etching solution etches the second metal layer, so that the first metal layer can be completely etched without leaving any residue. Also, the second metal layer needs to be completely etched away before the first metal layer is etched, so that the second metal layer will not have etching residue. During the etching process, the second metal layer is less likely to be corroded. A prerequisite for a formation of copper hollowing is that the patterned second metal layer is corroded, so the patterned second metal layer can avoid the copper hollowing out of the patterned copper layer.

In this embodiment, the first metal layer is a molybdenum layer, and the second metal layer is a molybdenum-titanium alloy layer. Since the etching solution can etch molybdenum more than molybdenum and titanium, a possibility of molybdenum and titanium residues is reduced. Because the molybdenum-titanium metal layer is in direct contact with the copper metal layer, and a difference in corrosion potential between the copper/molybdenum-titanium bimetal is small, the copper will not be corroded.

In this embodiment, a sum of thicknesses of the first metal layer and the second metal layer is greater than or equal to 5 nanometers and less than or equal to 100 nanometers. The thickness of the first metal layer and the second metal layer is the same as a thickness of a conventional single-layer molybdenum-titanium alloy layer. The thickness of the molybdenum-titanium alloy layer is less than that of the conventional molybdenum-titanium alloy. Thus, it can reduce a content of fluoride ions in the etching solution. The content of fluoride ion in the etching solution is greater than 0 wt % and less than 0.1 wt %. Furthermore, the content of fluoride ions in the etching solution is greater than 0 wt % and less than 0.01 wt %. For example, the content of fluoride ions in the etching solution is 0.005 wt %, so as to avoid excessive corrosion of the substrate caused by the high content of fluoride ions.

In this embodiment, the patterned metal member includes the source/drain (1131, 1132) and the data line (not shown). In other embodiments, the patterned metal member may also include a gate and a scan line, and a manufacturing method of the gate and the scan line is the same as the manufacturing method of the source/drain and the data line, which is not described in detail here.

In the manufacturing method of the array substrate of the embodiment, the first metal layer, second metal layer, and the copper layer are sequentially disposed, and the etching rate at which the etching solution etches the second metal layer is less than another etching rate at which the etching solution etches the first metal layer. With the patterned second metal layer and the patterned first metal layer, a problem of metal residues in the second metal layer can be avoided, and a problem of copper hollowing caused by corrosion of the patterned second metal layer can be avoided, and a risk of electrostatic breakdown is reduced. Moreover, an adhesion between the first metal layer and the substrate is greater than an adhesion between the copper layer and the substrate, which improves an adhesion of the patterned metal member on the substrate, and can block a diffusion of copper.

It should be noted that the embodiments described above are only used to help understand the technical solution of the present disclosure and its core ideas. A person skilled in the art should understand that the solution recorded in any of the preceding embodiments can be modified, or the partial technical features of the solution can be replaced equivalently, without departing from the spirit and scope of the technical solutions of the embodiments of the present disclosure.

What is claimed is:

1. An array substrate, comprising: a substrate and a patterned metal member, wherein the patterned metal member comprises a patterned first metal layer, a patterned second metal layer, and a patterned copper layer that are sequentially disposed on the substrate; and
   an adhesion force between the patterned first metal layer and the substrate is greater than another adhesion force between the patterned copper layer and the substrate, the patterned metal member is obtained by etching a first metal layer, a second metal layer, and a copper layer that are sequentially disposed on the substrate with an etching solution, an etching rate at which the etching solution etches the second metal layer is less than another etching rate at which the etching solution etches the first metal layer, material of the first metal layer comprises molybdenum, and material of the second metal layer comprises one of titanium or vanadium.

2. The array substrate as claimed in claim 1, wherein the first metal layer comprises a molybdenum layer, and the second metal layer comprises one of a molybdenum-vanadium alloy layer or a molybdenum-titanium alloy layer.

3. The array substrate as claimed in claim 2, wherein a sum of thicknesses of the first metal layer and the second metal layer is greater than or equal to 5 nanometers and less than or equal to 100 nanometers.

4. The array substrate as claimed in claim 1, wherein the patterned metal member comprises a source/drain and a data line; and/or
   the patterned metal member comprises a gate and a scan line.

5. A manufacturing method of an array substrate, comprising following steps:
   forming a first metal layer arranged full-area over a substrate;
   forming a second metal layer arranged full-area on the first metal layer away from the substrate;
   forming a copper layer arranged full-area on the second metal layer away from the first metal layer;
   forming a photoresist layer on a surface of the copper layer, wherein after the photoresist layer is exposed by a mask and developed by a developer, a remaining area of the photoresist layer covering the copper layer is a reserved area, and another area of the photoresist layer removed by the developer is an etching area; and
   etching, by an etching solution, the copper layer, the second metal layer, and the first metal layer of the etching area to remove a remaining photoresist layer and obtain a patterned metal member of the array substrate;
   wherein an etching rate at which the etching solution etches the first metal layer is greater than another etching rate at which the etching solution etches the second metal layer, and an adhesion force between the first metal layer and the substrate is greater than another adhesion force between the copper layer and the substrate; and
   wherein the first metal layer comprises a molybdenum layer, and the second metal layer comprises a molybdenum-titanium alloy layer.

6. The manufacturing method of the array substrate as claimed in claim 5, wherein material of the first metal layer comprises molybdenum, and material of the second metal layer is selected from the group consisting of titanium and vanadium.

7. The manufacturing method of the array substrate as claimed in claim 5, wherein a sum of thicknesses of the first metal layer and the second metal layer is greater than or equal to 5 nanometers and less than or equal to 100 nanometers, and a content of fluorine ions in the etching solution is greater than 0 wt % and less than 0.1 wt %.

8. The manufacturing method of the array substrate as claimed in claim 7, wherein the sum of the thicknesses of the first metal layer and the second metal layer is greater than or equal to 10 nanometers and less than or equal to 50 nanometers, and the content of the fluorine ions in the etching solution is greater than 0 wt % and less than 0.01 wt %.

9. The manufacturing method of the array substrate as claimed in claim 5, wherein a thickness of the first metal layer ranges from 5 nm to 100 nm, and a thickness of the second metal layer ranges from 5 nm to 100 nm.

10. The manufacturing method of the array substrate as claimed in claim 5, wherein the patterned metal member comprises a source/drain and a data line; and/or
the patterned metal member comprises a gate and a scan line.

11. An array substrate, comprising: a substrate and a patterned metal member, wherein the patterned metal member comprises a patterned first metal layer, a patterned second metal layer, and a patterned copper layer that are sequentially disposed on the substrate; and
an adhesion force between the patterned first metal layer and the substrate is greater than another adhesion force between the patterned copper layer and the substrate, the patterned metal member is obtained by etching a first metal layer, a second metal layer, and a copper layer that are sequentially disposed on the substrate with an etching solution, an etching rate at which the etching solution etches the second metal layer is less than another etching rate at which the etching solution etches the first metal layer; and
wherein the first metal layer comprises a molybdenum layer, and the second metal layer comprises a molybdenum-titanium alloy layer.

12. The array substrate as claimed in claim 11, wherein a sum of thicknesses of the first metal layer and the second metal layer is greater than or equal to 5 nanometers and less than or equal to 100 nanometers.

13. The array substrate as claimed in claim 11, wherein the patterned metal member comprises a source/drain and a data line; and/or
the patterned metal member comprises a gate and a scan line.

* * * * *